(12) United States Patent
Ishii et al.

(10) Patent No.: US 11,765,840 B2
(45) Date of Patent: Sep. 19, 2023

(54) COPPER FOIL WITH CARRIER

(71) Applicant: MITSUI MINING & SMELTING CO., LTD., Tokyo (JP)

(72) Inventors: Rintaro Ishii, Ageo (JP); Takenori Yanai, Ageo (JP); Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 431 days.

(21) Appl. No.: 16/957,508

(22) PCT Filed: Dec. 3, 2018

(86) PCT No.: PCT/JP2018/044391
§ 371 (c)(1),
(2) Date: Jun. 24, 2020

(87) PCT Pub. No.: WO2019/131000
PCT Pub. Date: Jul. 4, 2019

(65) Prior Publication Data
US 2021/0059057 A1 Feb. 25, 2021

(30) Foreign Application Priority Data
Dec. 27, 2017 (JP) ................. 2017-251237

(51) Int. Cl.
*H05K 3/46* (2006.01)
*H01B 5/14* (2006.01)
(Continued)

(52) U.S. Cl.
CPC ............. *H05K 3/4682* (2013.01); *B32B 7/04* (2013.01); *B32B 7/06* (2013.01); *B32B 15/01* (2013.01);
(Continued)

(58) Field of Classification Search
CPC ....... H05K 2203/016; H05K 2203/088; H05K 1/09; H05K 3/4682; H05K 3/467;
(Continued)

(56) References Cited

U.S. PATENT DOCUMENTS

2004/0038049 A1 2/2004 Suzuki et al.
2009/0291319 A1 11/2009 Nagatani et al.
(Continued)

FOREIGN PATENT DOCUMENTS

CN 106164327 A 11/2016
JP 2005-101137 4/2005
(Continued)

OTHER PUBLICATIONS

Machine Translation, Matsuura, WO 2017/149811, Sep. 2017. (Year: 2017).*
(Continued)

*Primary Examiner* — Michael E. La Villa
(74) *Attorney, Agent, or Firm* — GREENBLUM & BERNSTEIN, P.L.C.

(57) ABSTRACT

An extremely thin copper foil with a carrier is provided that can keep stable releasability even after being heated for a prolonged time at a high temperature of 350° C. or more. The extremely thin copper foil with a carrier includes a carrier composed of a glass or ceramic material; an intermediate layer provided on the carrier and composed of at least one metal selected from the group consisting of Cu, Ti, Al, Nb, Zr, Cr, W, Ta, Co, Ag, Ni, In, Sn, Zn, Ga, and Mo; a release layer provided on the intermediate layer and including a carbon sublayer and a metal oxide sublayer or containing metal oxide and carbon; and an extremely thin copper layer provided on the release layer.

20 Claims, 2 Drawing Sheets

(51) Int. Cl.

| | |
|---|---|
| *B32B 15/01* | (2006.01) |
| *C23C 30/00* | (2006.01) |
| *C23C 14/00* | (2006.01) |
| *B32B 15/04* | (2006.01) |
| *C23C 14/02* | (2006.01) |
| *C23C 14/18* | (2006.01) |
| *H05K 1/09* | (2006.01) |
| *B32B 7/06* | (2019.01) |
| *B32B 17/06* | (2006.01) |
| *B32B 15/20* | (2006.01) |
| *B32B 18/00* | (2006.01) |
| *C23C 28/00* | (2006.01) |
| *C23C 14/06* | (2006.01) |
| *C23C 14/08* | (2006.01) |
| *B32B 7/04* | (2019.01) |

(52) U.S. Cl.
CPC .......... *B32B 15/04* (2013.01); *B32B 15/043* (2013.01); *B32B 15/20* (2013.01); *B32B 17/06* (2013.01); *B32B 18/00* (2013.01); *C23C 14/024* (2013.01); *C23C 14/025* (2013.01); *C23C 14/06* (2013.01); *C23C 14/08* (2013.01); *C23C 14/085* (2013.01); *C23C 14/086* (2013.01); *C23C 14/087* (2013.01); *C23C 14/185* (2013.01); *C23C 28/00* (2013.01); *C23C 28/30* (2013.01); *C23C 28/321* (2013.01); *C23C 28/34* (2013.01); *C23C 28/341* (2013.01); *C23C 28/343* (2013.01); *C23C 28/345* (2013.01); *C23C 28/3455* (2013.01); *C23C 30/00* (2013.01); *C23C 30/005* (2013.01); *H01B 5/14* (2013.01); *H05K 1/09* (2013.01); *H05K 3/467* (2013.01); *B32B 2311/12* (2013.01); *C23C 14/0605* (2013.01); *C23C 14/081* (2013.01); *C23C 14/083* (2013.01); *C23C 14/18* (2013.01); *H05K 2201/0355* (2013.01); *H05K 2203/016* (2013.01); *H05K 2203/088* (2013.01); *Y10T 428/1291* (2015.01); *Y10T 428/12188* (2015.01); *Y10T 428/12229* (2015.01); *Y10T 428/12451* (2015.01); *Y10T 428/12597* (2015.01); *Y10T 428/12611* (2015.01); *Y10T 428/12618* (2015.01); *Y10T 428/12625* (2015.01); *Y10T 428/12882* (2015.01); *Y10T 428/12903* (2015.01); *Y10T 428/12917* (2015.01); *Y10T 428/12924* (2015.01); *Y10T 428/2495* (2015.01); *Y10T 428/24967* (2015.01); *Y10T 428/265* (2015.01)

(58) Field of Classification Search
CPC ........ H05K 2201/0355; B32B 2311/12; B32B 7/06; B32B 7/04; B32B 15/04; B32B 15/20; B32B 15/01; B32B 15/043; B32B 17/06; B32B 18/00; C23C 14/024; C23C 14/06; C23C 14/185; C23C 14/0605; C23C 14/081; C23C 14/083; C23C 14/18; C23C 14/025; C23C 14/085; C23C 14/086; C23C 14/087; C23C 28/00; C23C 28/30; C23C 28/321; C23C 28/34; C23C 28/341; C23C 28/343; C23C 28/345; C23C 28/3455; C23C 30/00; C23C 30/005; H01B 5/14; Y10T 428/12903; Y10T 428/12992; Y10T 428/1291; Y10T 428/12917; Y10T 428/12924; Y10T 428/2495; Y10T 428/24967; Y10T 428/265; Y10T 428/12597; Y10T 428/12611; Y10T 428/12618; Y10T 428/12625; Y10T 428/12451; Y10T 428/12229; Y10T 428/12188

See application file for complete search history.

(56) References Cited

U.S. PATENT DOCUMENTS

| | | | |
|---|---|---|---|
| 2010/0140100 A1* | 6/2010 | Kim | H05K 3/205 205/125 |
| 2017/0188457 A1 | 6/2017 | Matsuura et al. | |
| 2018/0151268 A1 | 5/2018 | Matsuura | |

FOREIGN PATENT DOCUMENTS

| | | |
|---|---|---|
| JP | 2006-22406 A | 1/2006 |
| JP | 2007-307767 A | 11/2007 |
| JP | 2008-255462 A | 10/2008 |
| KR | 10-2010-0065547 | 6/2010 |
| TW | 201742225 A | 12/2017 |
| WO | 02/24444 A1 | 3/2002 |
| WO | 2016/043058 A1 | 3/2016 |
| WO | 2016/174970 A1 | 11/2016 |
| WO | 2017/015084 A1 | 1/2017 |
| WO | 2017/149811 A1 | 9/2017 |
| WO | 2017/150283 A1 | 9/2017 |
| WO | 2017/150284 A1 | 9/2017 |

OTHER PUBLICATIONS

Machine Translation, Matsuura, WO 2017/149811 A1, Sep. 2017. (Year: 2017).*
International Search Report issued in International Patent Application No. PCT/JP2018/044391, dated Feb. 12, 2019, English translation.
Office Action, Taiwan Patent Office, Counterpart Patent Appl. No. 107144664, dated Jul. 15, 2019, English translation.
Written Opinion, WIPO, International Application No. PCT/JP2018/044391, dated Feb. 12, 2019, English translation.
International Preliminary Report on Patentability issued in International Patent Application No. PCT/JP2018/044391, dated Jun. 30, 2020, English translation.

* cited by examiner

COPPER FOIL WITH CARRIER

TECHNICAL FIELD

The present invention relates to a copper foil with a carrier.

BACKGROUND ART

In recent years, multilayering of printed circuit boards has been widely prevailed to increase the mounting density of printed circuit boards and miniaturize the boards. Such multilayer printed circuit boards have been extensively used in portable electronic devices for the purpose of weight reduction and miniaturization. These multilayer printed circuit boards require a further reduction in thickness of interlayer insulating layers and a further reduction in weight of circuit boards.

A technique that satisfies such requirements employs a method of manufacturing a multilayer printed circuit board by a coreless build-up process. In the coreless build-up process, insulating layers and wiring layers are alternately stacked (built up) into a multilayer structure without use of so-called core substrate. In the coreless build-up process, the use of a copper foil with a carrier has been proposed to facilitate the separation of the multilayer printed circuit board from a support. For example, PTL 1 (JP2005-101137A) discloses a method of manufacturing a packaging substrate for mounting semiconductor devices, the method comprising: bonding an insulating resin layer to a carrier surface of a copper foil with a carrier to form a support; forming a first wiring conductor through a photoresist process on the extremely thin copper layer of the copper foil with a carrier, a patterned electroplating process of copper, and a removing process of the photoresist; forming a build-up wiring layer by stacking an insulating material and subjecting the insulating material to a hot press process; separating a support substrate with a carrier; and removing the extremely thin copper layer.

In such processes for production of multilayer printed circuit boards, the hot press process is carried out each time the insulating material is stacked. Thus, the copper foil with a carrier is heated for a prolonged time at high temperature. The temperatures of hot press processes depend on the curing temperatures of insulating materials and thus vary in a wide range of, for example, 160 to 400° C. depending on types of insulating materials. A hot press process at a higher heating temperature is known to increase the release strength of the copper foil with a carrier, resulting in a loss in releasability of the carriers.

Several copper foils with carriers have been proposed that can address an increase in release strength due to heating. For example, PTL 2 (JP2007-307767A) discloses a copper foil with a carrier, including, in sequence: a carrier; a joint interface layer or a carbon layer; and a copper foil, where the carrier is readily releasable from the copper foil even after being heated to a high temperature above 180° C. PTL 3 (JP2006-22406A) discloses a copper foil with a carrier including, in sequence: a release layer (for example, a chromium layer); a diffusion barrier layer (for example, a nickel layer); and an electroplated copper layer, where the layers are stacked on the carrier and the carrier is readily releasable from a copper-clad laminate produced by a casting process or a thermal compression bonding process at high temperature.

In order to achieve further reductions in thicknesses of extremely thin copper foils with carriers, deposition of an extremely thin copper layer by physical vapor deposition (PVD), for example, sputtering, has been proposed. For example, PTL 4 (WO2017/150283) discloses a copper foil with a carrier, including, in sequence, a carrier, a release layer, an antireflective layer, and an extremely thin copper layer, where the release layer, the antireflective layer, and the extremely thin copper layer are deposited by sputtering. PTL 5 (WO2017/150284) discloses a copper foil with a carrier, including a carrier, intermediate layers (for example, an adhesive metal layer and a release assisting layer), a release layer, and an extremely thin copper layer, where the intermediate layers, the release layer, and the extremely thin copper layer are deposited by sputtering. In PTLs 3 and 4, a preferred release layer is a carbon layer.

CITATION LIST

Patent Literature

[PTL 1] JP2005-101137A
[PTL 2] JP2007-307767A
[PTL 3] JP2006-22406A
[PTL 4] WO2017/150283
[PTL 5] WO2017/150284

SUMMARY OF INVENTION

Unfortunately, the copper foils with carriers including carbon layers, namely joint interface layers or release layers disclosed in PTLs 2, 4, and 5 have release strengths that are stable at low levels after being heated to a temperature of about 180° C. whereas they have excessively increased release strengths after being heated to a higher temperature (for example, 350° C.). PTL 3 discloses that the release strength of the copper foil with a carrier is significantly affected by the amount of deposited chromium, where stable control of the release strength is difficult. In conclusion, none of the conventional copper foils with carriers can keep stable releasability of the carriers after being heated to 350° C. or more.

An insulating layer composed of a highly reliable insulating material (for example, polyimide resin) regardless of a high curing temperature can achieve a copper foil with a carrier suitable for a broad range of applications requiring higher reliability in the formation of a circuit pattern for packaging. Thus, a copper foil with a carrier is desired that can keep stable releasability of the carrier even after being heated for a prolonged time at a high temperature of 350° C. or more.

The present inventors have discovered that by providing a release layer between an intermediate layer and an extremely thin copper layer of a copper foil with a carrier where the release layer comprises a metal oxide sublayer and a carbon sublayer, it is possible to provide an extremely thin copper foil with a carrier that can keep stable releasability of the carrier even after being heated for a prolonged time at a high temperature of 350° C. or more.

An object of the present invention is to provide an extremely thin copper foil with a carrier that can keep stable releasability of the carrier even after being heated to a high temperature of 350° C. or more.

According to an aspect of the present invention, there is provided a copper foil with a carrier, comprising:
  a carrier composed of a glass or ceramic material;
  an intermediate layer provided on the carrier and composed of at least one metal selected from the group consisting of Cu, Ti, Al, Nb, Zr, Cr, W, Ta, Co, Ag, Ni, In, Sn, Zn, Ga, and Mo;

a release layer provided on the intermediate layer and comprising a metal oxide sublayer and a carbon sublayer or comprising metal oxide and carbon; and an extremely thin copper layer provided on the release layer.

According to another aspect of the present invention, there is provided a method for manufacturing the copper foil with a carrier, comprising forming on the carrier the intermediate layer, the carbon sublayer, the metal oxide sublayer, optionally the etching stopper layer, and the extremely thin copper layer by physical vapor deposition (PVD).

DESCRIPTION OF EMBODIMENTS

Copper Foil with Carrier

Figure 1:
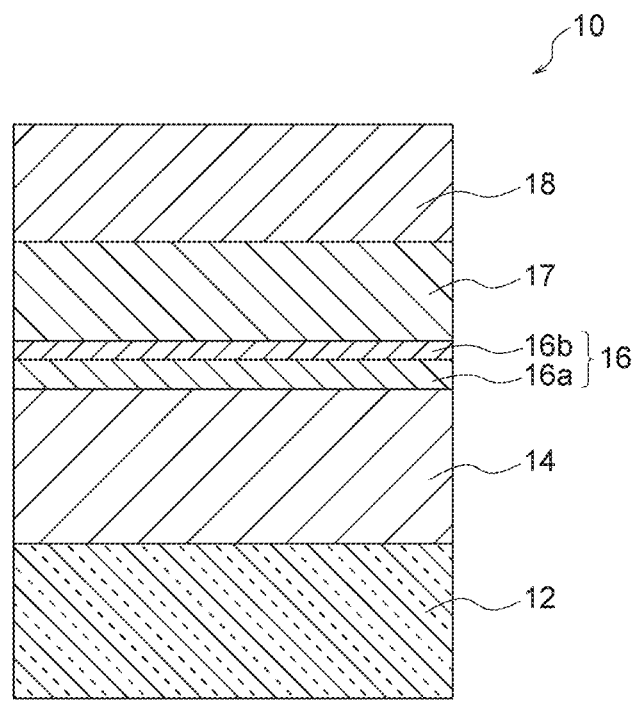
FIG. 1 is a schematic cross-sectional view illustrating an aspect of a copper foil with a carrier of the present invention.

FIG. 1 schematically illustrates an exemplary copper foil with a carrier of the present invention. As illustrated in FIG. 1, a copper foil with a carrier 10 of the present invention includes, in sequence, a carrier 12, an intermediate layer 14, a release layer 16, and an extremely thin copper layer 18. The carrier 12 is composed of a glass or ceramic material. The intermediate layer 14 is provided on the carrier 12 and composed of at least one metal selected from the group consisting of Cu, Ti, Al, Nb, Zr, Cr, W, Ta, Co, Ag, Ni, In, Sn, Zn, Ga, and Mo. The release layer 16 is provided on the intermediate layer 14 and comprises a metal oxide sublayer 16a and a carbon sublayer 16b or contains metal oxide and carbon. The extremely thin copper layer 18 is provided on the release layer 16 and composed of copper. The copper foil with a carrier 10 of the present invention may further include an etching stopper layer 17 between the release layer 16 and the extremely thin copper layer 18 as desired. The aforementioned layers may be stacked on two sides of the carrier 12 to be symmetric about the carrier 12. The copper foil with a carrier 10 may have any known layer structure with the proviso that it includes the intermediate layer 14 and the release layer 16. In this manner, the release layer 16, which comprises the metal oxide sublayer 16a and the carbon sublayer 16b that are provided between the intermediate layer 14 and the extremely thin copper layer 18 of the copper foil with a carrier 10, can keep stable releasability of the carrier 10 even after being heated for a prolonged time (for example, for two hours or more) at a high temperature of 350° C. or more. Thus, it is preferred to use the copper foil with a carrier of the present invention at 350° C. or more.

Figure 3:
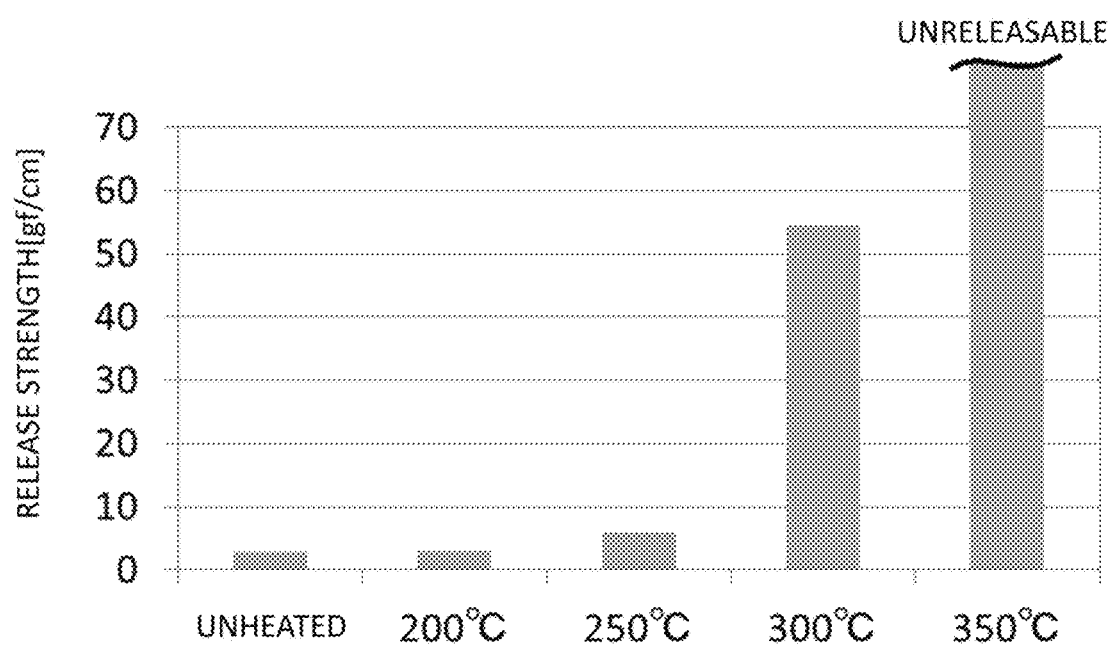
FIG. 3 is a graph showing release strengths of conventional copper foils with carriers after being heated for one hour at different temperatures.

As described above, the release strengths of conventional copper foils with carriers excessively increase after being heated to a high temperature of 350° C. or more. Thus, stable releasability of the carriers cannot be kept. Although it is not clear, the mechanism of an increase in release strength is speculated as follows: Since the intermediate layer 14 and the extremely thin copper layer 18 (and also the etching stopper layer 17 if present) are composed of metals, heating of the copper foil with a carrier 10 at high temperature may cause interdiffusion of metal elements originated from these layers. In this regards, the carbon sublayer 16b contributes to stable release of the carrier while permitting interdiffusion of the metal elements. In the case that the release layer 16 consists of only the carbon sublayer 16b as disclosed in PTLs 1, 3, and 4, the metal elements may pass through the release layer 16 to diffuse into the intermediate layer 14. As a result, additional intermetallic bonding occurs in the region between the intermediate layer 14 and the extremely thin copper layer 18 (or the etching stopper layer 17 if present), resulting in an increase in release strength. FIG. 3 is a graph showing exemplary release strengths of copper foils with carriers each including the release layer 16 consisting of only a carbon sublayer 16b where the copper foils with the carriers are heated for one hour at different temperatures. As illustrated in FIG. 3, the release strength of the copper foil with a carrier, which includes the release layer 16 consisting of only the carbon sublayer 16b, increases after the foil is heated to 300° C. or more. It is demonstrated that the carrier cannot be released after being heated to 350° C. or more. In contrast, the copper foil with a carrier 10 of the present invention, which includes the release layer 16 including not only the carbon sublayer 16b but also the metal oxide sublayer 16a (or containing carbon and metal oxide) can prevent an excess increase in release strength due to heating and keep stable releasability of the carrier. In other words, the metal oxide sublayer 16a has superior barrier effects against interdiffusion of metal elements. Even after being heated to a high temperature of 350° C. or more, the metal oxide sublayer 16a can block the metal elements to pass through the release layer 16 then to diffuse into the intermediate layer 14. As a result, additional intermetallic bonding can be effectively reduced in the region between the intermediate layer 14 and the extremely thin copper layer 18 (or the etching stopper layer 17 if present). In this manner, the copper foil with a carrier 10 of the present invention can keep stable releasability of the carrier even after being heated for a prolonged time at a high temperature of 350° C. or more.

The carrier 12 is composed of a glass or ceramic material. The carrier 12 may be of any form, such as a sheet, film, or plate. The carrier 12 may be a laminate of such a sheet, a film, and a plate. For example, it is preferred that the carrier 12 be a rigid support, such as a glass or ceramic plate. Examples of the ceramic constituting the carrier 12 include alumina, zirconia, silicon nitride, aluminum nitride, and other various fine ceramics. In order to prevent warpage of the copper foil with a carrier 10, materials having a thermal expansion coefficient (CTE) of less than 25 ppm/K (typically 1.0 to 23 ppm/K) are more preferred. Examples of such materials include ceramics and glasses as described above. In view of handling properties and securing the flatness when a chip is mounted, the carrier 12 has a Vickers hardness of preferably 100 HV or more, more preferably 150 to 2500 HV. For materials that satisfies these properties, the carrier 12 is preferably composed of a glass material, for example, a glass plate or glass sheet. The carrier 12 composed of a glass material has advantages, such as light weight, low thermal expansion coefficient, high insulating properties, high rigidity, and high surface flatness, and thus the extremely thin copper layer 18 has a significantly smooth surface. The carrier 12 composed of a glass material has further advantages, for example, high visibility contrast to copper plating during image inspection after deposition of a wiring layer, surface flatness (coplanarity) suitable for mounting electronic devices, chemical resistance during a desmear step and various plating steps in a manufacturing process of the printed circuit board, and release of the carrier 12 from the copper foil with a carrier 10 by a chemical separation process. Preferred examples of the glass constituting the carrier 12 include quartz glass, borosilicate glass, alkali-free glass, soda-lime glass, aluminosilicate glass, and combinations thereof, more preferably alkali-free glass, soda-lime glass, and combination thereof, particularly preferably alkali-free glass. The alkali-free glass, which contains substantially no alkali metal, contains silicon dioxide, aluminum oxide, boron oxide, an alkaline earth metal oxide, such as calcium oxide or barium oxide as main components, and further contains boric acid. Since the alkali-free glass has a low thermal expansion coefficient in the range of 3 to 5 ppm/K over a wide temperature range from 0° C. to 350° C., the warpage of the glass can be advantageously minimized in a process involving heating. The carrier 12 has a thickness of preferably 100 to 2000 µm, more preferably 300 to 1800 µm, further preferably 400 to 1100 µm. At a thickness within such a range, the printed circuit board can be thinned while retaining adequate strength that does not interfere with handling and electronic components can be mounted with reduced warpage.

The surface, adjacent to the intermediate layer 14, of the carrier 12 has an arithmetic mean roughness Ra of preferably 0.1 to 70 nm, more preferably 0.5 to 60 nm, further preferably 1.0 to 50 nm, particularly preferably 1.5 to 40 nm, most preferably 2.0 to 30 nm as measured in accordance with JIS B 0601-2001. A smaller arithmetic mean roughness on the surface, adjacent to the intermediate layer 14, of the carrier 12 desirably causes a smaller arithmetic mean roughness Ra on the surface, remote from the release layer 16 (the outer surface of the extremely thin copper layer 18), of the extremely thin copper layer 18. As a result, the roughness Ra is suitable for forming a wiring pattern highly refined to a line/space (LS) ratio of 13 µm or less/13 µm or less (for example, from 12 µm/12 µm to 2 µm/2 µm) in a printed circuit board manufactured with the copper foil with a carrier 10.

The intermediate layer 14 is interposed between the carrier 12 and the release layer 16 to ensure adhesion between the carrier 12 and the release layer 16. The metal constituting the intermediate layer 14 is Cu, Ti, Al, Nb, Zr, Cr, W, Ta, Co, Ag, Ni, In, Sn, Zn, Ga, Mo, or combination thereof (hereinafter referred to as "metals M"), preferably Cu, Ti, Al, Nb, Zr, Cr, W, Ta, Co, Ag, Ni, Mo, or combination thereof, more preferably Cu, Ti, Zr, Al, Cr, W, Ni, Mo, or combination thereof, further preferably Cu, Ti, Al, Cr, Ni, Mo, or combination thereof, particularly preferably Cu, Ti, Al, Ni, or combination thereof. The intermediate layer 14 may be a pure metal or an alloy. The metal constituting the intermediate layer 14 may contain incidental impurities originated from, for example, raw material components and a deposition process. Also, the metal may contain oxygen originated from the air when the intermediate layer is exposed to the air after the deposition of the intermediate layer 14. The content of the metal may have any upper limit, which may be 100 atomic %. The intermediate layer 14 is preferably deposited by physical vapor deposition (PVD), more preferably by sputtering. In particular, the intermediate layer 14 is preferably deposited by a magnetron sputtering process because the process can improve the uniformity of distribution in film thickness. The intermediate layer 14 has a thickness of preferably 10 to 1000 nm, more preferably 30 to 800 nm, further preferably 60 to 600 nm, particularly preferably 100 to 400 nm. The thickness is measured by analyzing the cross-sectional area of the layer with an energy dispersive X-ray spectrometer in a transmission electron microscope (TEM-EDX).

The intermediate layer 14 may have a monolayer or multilayer structure. In the case that the intermediate layer 14 is a single-layer structure, the intermediate layer 14 is a metal layer composed of preferably Cu, Al, Ti, Ni, or combination thereof (for example, an alloy or an intermetallic compound), more preferably Al, Ti, or combination thereof (for example, an alloy or an intermetallic compound), further preferably Al-containing layer or Ti-containing layer. In the case that the intermediate layer 14 is composed of a metal or an alloy having insufficient adhesion to the carrier 12, the intermediate layer 14 is preferably a double-layer structure. In detail, one sublayer composed of a metal (for example, Ti) or an alloy having superior adhesion to the carrier 12 adjoins the carrier 12 and another sublayer composed of a metal (for example, Cu) or an alloy having inferior adhesion to the carrier 12 adjoins the release layer 16, resulting in improved adhesion to the carrier 12. Thus, an exemplary double-layer structure of the intermediate layer 14 is a laminate structure consisting of a Ti-containing sublayer adjoining the carrier 12 and a Cu-containing sublayer adjoining the release layer 16. Since a variation in the proportion of the constituent elements in or in the thicknesses of the two sublayers leads to a variation in the release strength, it is preferred to appropriately adjust the proportion of the constituent elements in or the thickness of each sublayer. Throughout this specification, the category of "metal M-containing layers" includes layers composed of alloys containing other elements in addition to the metals M in an amount that does not impair the releasability of the carrier. In other words, the intermediate layer 14 mainly contains a metal M. From this viewpoint, the content of the metal M in the intermediate layer 14 is preferably 50 to 100 atomic %, more preferably 60 to 100 atomic %, further preferably 70 to 100 atomic %, particularly preferably 80 to 100 atomic %, most preferably 90 to 100 atomic %.

The release layer 16, which enables release of the carrier 12 (provided with the intermediate layer 14), comprises the metal oxide sublayer 16a and the carbon sublayer 16b or contains metal oxide and carbon. The carbon sublayer 16b can contributes to stable release of the carrier 12. The metal oxide sublayer 16a can prevent thermal interdiffusion of metal elements originated from the intermediate layer 14 and the extremely thin copper layer 18 (or the etching stopper layer 17 if present). As a result, stable releasability of the carrier can be kept even after being heated to a high temperature (for example, 350° C. or more). The metal oxide sublayer 16a and the carbon sublayer 16b may be disposed in any sequence. The metal oxide sublayer 16a may adjoin the intermediate layer 14 and the carbon sublayer 16b may be provided adjacent to the extremely thin copper layer 18 (in other words, the carbon sublayer 16b may adjoin the etching stopper layer 17 or the extremely thin copper layer 18). Alternatively, the carbon sublayer 16b may adjoin the intermediate layer 14 and the metal oxide sublayer 16a may be provided adjacent to the extremely thin copper layer 18 (in other words, the metal oxide sublayer 16a may adjoin the etching stopper layer 17 or the extremely thin copper layer 18). Alternatively, the release layer 16 may exist in a state of a mixed phase in which the boundary between the metal oxide sublayer 16a and the carbon sublayer 16b is not clearly specified (i.e., a layer containing a metal oxide and carbon).

The metal oxide sublayer 16a contains an oxide of a metal composed of preferably Cu. Ti, Al, Nb, Zr, Cr, W, Ta, Co, Ag, Ni, In, Sn, Zn, Ga, Mo, or combination thereof (hereinafter referred to as "metal oxides MO"), more preferably Cu, Ti, Al, Nb, Zr, Cr, W, Ta, Co, Ag, Ni, Mo, or combination thereof, further preferably Cu, Ti, Zr, Al, Cr, W, Ni, Mo, or combination thereof, particularly preferably Cu, Ti, Al, Cr, Ni, Mo, or combination thereof, most preferably Cu, Ti, Al, Ni, or combination thereof. The metal oxide sublayer 16a is preferably deposited by physical vapor deposition (PVD), more preferably by sputtering. The metal oxide sublayer 16a is preferably deposited by a reactive sputtering process using a metal target under an oxidizing atmosphere because the process can readily control the thickness of a film by adjusting the deposition time. The metal oxide sublayer 16a has a thickness of preferably 100 nm or less, more preferably 60 nm or less, further preferably 30 nm or less, particularly preferably 10 nm or less. The thickness is measured by analyzing the cross-sectional area of the sublayer with an energy dispersive X-ray spectrometer in a transmission electron microscope (TEM-EDX).

The metal oxide sublayer 16a preferably contains an oxide of a metal constituting the intermediate layer 14 to facilitate the production. Examples of preferred combination of the intermediate layer 14 and the metal oxide sublayer 16a include (i) a combination of an intermediate layer 14 that includes a Ti-containing sublayer adjoining the carrier 12 and a Cu-containing sublayer adjoining the release layer 16; and a metal oxide sublayer 16a that is a copper oxide layer, (ii) a combination of an intermediate layer 14 that is a Ti-containing layer and a metal oxide sublayer 16a that is a titanium oxide layer, and (iii) a combination of an intermediate layer 14 that is an Al-containing layer and a metal oxide sublayer 16a that is an aluminum oxide layer. The metal oxide sublayer 16a according to such an embodiment can be produced by not only the reactive sputtering but also an oxidation treatment of a surface of the intermediate layer 14. The oxidation treatment may be carried out by exposing the intermediate layer 14 deposited in vacuum to an oxidizing atmosphere (for example, air). Throughout the specification, the category of "metal oxide MO layers" includes layers containing other elements in addition to the metal oxides MO in an amount that does not impair the releasability of the carrier. In other words, the metal oxide sublayer 16a mainly contains a metal oxide MO.

The carbon sublayer 16b is mainly composed of preferably carbon or hydrocarbon, more preferably a film of amorphous carbon being hard carbon. In this case, the carbon sublayer 16b has a carbon content of preferably 60 atomic % or more, more preferably 70 atomic % or more, further preferably 80 atomic % or more, particularly preferably 85 atomic % or more, measured by XPS. The carbon content may have any upper limit, for example, which may be 100 atomic %, and is practically 98 atomic % or less. The carbon sublayer 16b may contain incidental impurities (for example, oxygen, carbon, and hydrogen originated from an ambient environment, such as an atmosphere). Metal atoms originated from a deposition process of the etching stopper layer 17 or the extremely thin copper layer 18 may be trapped into the carbon sublayer 16b. Carbon is less diffusible to and less reactive with the carrier 12. Even during a relatively high-temperature press process (for example, at 180° C.), the carbon sublayer 16b can prevent formation of a metallic bond between the copper foil and a bonded interface due to heating and keep the carrier 12 readily releasable. The carbon sublayer 16b is preferably deposited by physical vapor deposition (PVD), more preferably by sputtering to avoid trap of excess incidental impurities in amorphous carbon and to keep continuous deposition of the intermediate layer 14 as described above. The carbon sublayer 16b has a thickness of preferably 1 to 20 nm, more preferably 1 to 10 nm. The thickness is measured by analyzing the cross-sectional area of the sublayer with an energy dispersive X-ray spectrometer in a transmission electron microscope (TEM-EDX).

The etching stopper layer 17, which is provided as desired between the release layer 16 and the extremely thin copper layer 18, is barely etched in a copper flash etching solution compared to the extremely thin copper layer 18. Preferred examples of the metal constituting the etching stopper layer 17 include Ti, Al, Nb, Zr, Cr, W, Ta, Co, Ag, Ni, Mo, and combination thereof. More preferred examples of the metal include Ti, Zr, Al, Cr, W, Ni, Mo, and combination thereof. Further preferred examples of the metal include Ti, Al, Cr, Ni, Mo, and combination thereof. Particularly preferred examples of the metal include T, Mo, and combination thereof. These elements are insoluble in a copper flash etching solution, resulting in a high chemical resistance against the copper flash etching solution. In addition, the release layer 16 of the copper foil with a carrier 10 of the present invention effectively prevents diffusion of metal elements originated from the etching stopper layer 17. Thus, the etching stopper layer 17 can keep desired chemical resistance without deterioration even after the foil is heated to a high temperature at 350° C. or more. The etching stopper layer 17 may be composed of a pure metal or an alloy. The metal constituting the etching stopper layer 17 may contain incidental impurities originated from, for example, raw materials and a deposition process. The content of the metal may have any upper limit, which may be 100 atomic %. The etching stopper layer 17 is preferably deposited by physical vapor deposition (PVD), more preferably by sputtering. The etching stopper layer 17 has a thickness of preferably 1 to 500 nm, more preferably 10 to 400 nm, further preferably 30 to 300 nm, particularly preferably 50 to 200 nm.

The metal constituting the intermediate layer 14 preferably has a standard electrode potential equal to or higher than that of the metal constituting the etching stopper layer 17. In other words, the metal constituting the etching stopper layer 17 preferably has an ionization tendency equal to or higher than that of the metal constituting the intermediate layer 14. This relation can further improve the releasability of the copper foil with a carrier 10 after being heated for a prolonged time at a high temperature of 350° C. or more. In such an embodiment, the metal element originated from the etching stopper layer 17 diffuse into the bonded interface of the metal oxide sublayer 16a. The metal element is readily oxidized into metal oxide. As a result, additional intermetallic bonding occurring in a region between the intermediate layer 14 and the etching stopper layer 17 can be further reduced. An excess increase in release strength due to heating can also be prevented.

The extremely thin copper layer 18 is composed of copper. The copper constituting the extremely thin copper layer 18 may contain incidental impurities originated from, for example, raw material components and a deposition process. The extremely thin copper layer 18 may be a copper foil produced by any process, for example, a wet process, such as an electroless copper plating or an electrolytic copper plating; a physical vapor deposition (PVD) process, such as sputtering or vacuum vapor deposition; chemical vapor deposition; or a combination thereof. The extremely thin copper layer is composed of particularly preferably a copper layer deposited by physical vapor deposition (PVD), such as sputtering or vacuum vapor deposition, most preferably a copper layer deposited by sputtering in order to appropriately build a fine pitch through an extremely thinning process. Although the extremely thin copper layer 18 is preferably a non-roughened copper layer, it may be subjected to preliminary roughening or secondary roughening, such as soft etching, cleaning, or oxidation-reduction, as long as the roughening process does not interfere with the formation of a wiring pattern when a printed wiring board is manufactured. The extremely thin copper layer 18 may have any thickness of, preferably 10 to 1000 nm, more preferably 20 to 900 nm, further preferably 30 to 700 nm, particularly preferably 50 to 600 nm, particularly more preferably 70 to 500 nm, most preferably 100 to 400 nm in order to form a fine pitch as described above. The extremely thin copper layer having a thickness within the above range is preferably manufactured by sputtering from the viewpoint of the in-plane uniformity of the layer thickness and the productivity to yield a layer in the form of a sheet or a roll.

The surface, remote from the release layer 16 (the outer surface of the extremely thin copper layer 18), of the extremely thin copper layer 18 has an arithmetic mean roughness Ra of preferably 1.0 to 100 nm, more preferably 2.0 to 40 nm, further preferably 3.0 to 35 nm, particularly preferably 4.0 to 30 nm, most preferably from 5.0 to 15 nm as measured in accordance with JIS B 0601-2001. A smaller arithmetic mean roughness is suitable for forming a wiring pattern more highly refined to a line/space (US) ratio of 13 μm or less/13 μm or less (for example, from 12 μm/12 μm to 2 μm/2 μm) in a printed wiring board manufactured with the copper foil with a carrier 10.

The intermediate layer 14, the metal oxide sublayer 16a, the carbon sublayer 16b, the etching stopper layer 17 (if present), and the extremely thin copper layer 18 are preferably physical-vapor-deposited (PVD) films, in other words, films deposited by physical vapor deposition (PVD), more preferably sputtered films, in other words, films deposited by sputtering.

Method of Producing Copper Foil with Carrier

The copper foil with a carrier 10 can be produced by providing the carrier 12 and forming the intermediate layer 14, the release layer 16 (comprising the metal oxide sublayer 16a and the carbon sublayer 16b in any sequence), the etching stopper layer 17 (optional), and the extremely thin copper layer 18 on the carrier 12. Each of the intermediate layer 14, the release layer 16, the etching stopper layer 17 (if present), and the extremely thin copper layer 18 is preferably deposited by physical vapor deposition (PVD) from the viewpoint of production of fine-pitch circuit patterns through thinning of the copper foil. Examples of the physical vapor deposition (PVD) include sputtering, vacuum vapor deposition, and ion plating. The sputtering process is most preferred from the viewpoint of, for example, control of the thickness of a film in a wide range, such as 0.05 nm to 5000 nm, and ensuring a uniform thickness of the film over a large width or area. In particular, deposition of all the intermediate layer 14, the release layer 16, the etching stopper layer 17 (if present), and the extremely thin copper layer 18 by the sputtering process significantly enhances production efficiency. The film may be deposited by any physical vapor deposition (PVD) process with a known vapor deposition system under known conditions. For example, any known sputtering process, such as magnetron sputtering, two-electrode sputtering, or facing targets sputtering, may be employed. The magnetron sputtering is preferred because it has a high deposition rate and a high productivity. The sputtering process may be performed with either direct-current (DC) power or radio-frequency (RF) power. The target may be, for example, a well-known plate target. From the viewpoint of efficiency of use, a cylindrical target is preferably used. The deposition of the intermediate layer 14, the release layer 16 (consisting of the metal oxide sublayer 16a and the carbon sublayer 16b in any sequence), the etching stopper layer 17 (if present), and the extremely thin copper layer 18 by physical vapor deposition (PVD) (preferably by sputtering) will now be described.

In the PVD, the intermediate layer 14 is preferably deposited by magnetron sputtering under a non-oxidizing atmosphere using a target composed of at least one metal selected from the group consisting of Cu, Ti, Al, Nb, Zr, Cr, W, Ta, Co, Ag, Ni, In, Sn, Zn, Ga, and Mo because the intermediate layer 14 has a highly uniform thickness. The target preferably has a purity of 99.9% or more. The gas used in the sputtering process is preferably an inert gas, for example, gaseous argon. The flow rate of the gaseous argon may be appropriately determined depending on the volume of a sputtering chamber and the conditions for the deposition process. A pressure ranging from 0.1 to 20 Pa is preferably applied during deposition to keep continuous deposition without operational failure of the vapor deposition system, such as abnormal electric discharge. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of deposition.

In the PVD, the metal oxide sublayer 16a is preferably deposited by reactive sputtering under an oxidizing atmosphere using a target composed of at least one metal selected from the group consisting of Cu. Ti, Al, Nb, Zr, Cr, W, Ta, Co, Ag, Ni, In, Sn, Zn, Ga, and Mo because the thickness of a film can be readily controlled. The target preferably has a purity of 99.9% or more. The gas used in the sputtering is preferably a mixture of an inert gas (for example, gaseous argon) and an oxidizing gas (for example, gaseous oxygen). The flow rates of the inert gas and the oxidizing gas may be appropriately determined depending on the volume of a sputtering chamber and the conditions for the deposition process. A pressure ranging from 0.1 to 1.0 Pa is preferably applied during deposition to keep continuous deposition without operational failure of the vapor deposition system, such as abnormal electric discharge. The pressure range may be determined by adjustments of the deposition power and the flow rates of the inert gas and the oxidizing gas depending on, for example, the structure and capacity of the system, the evacuation capacity of the vacuum pump, and the rating capacity of the deposition power. The sputtering power may be appropriately determined within a range of 0.05 to 15.0 W/cm$^2$ per unit area of the target in view of, for example, the uniformity of the thickness of the film and the productivity of deposition.

The carbon sublayer 16b is preferably deposited by physical vapor deposition (PVD) (preferably by sputtering) using a carbon target under an inert atmosphere, for example, an argon atmosphere. The carbon target is preferably composed of graphite that may contain incidental impurities (for example, oxygen and carbon originating from an ambient environment, such as an atmosphere). The carbon target preferably has a purity of at least 99.99%, more preferably at least 99.999%. A pressure ranging from 0.1 to 2.0 Pa is preferably applied during deposition to keep continuous deposition without operational failure of the vapor deposition system, such as abnormal electric discharge. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of deposition.

In the PVD, the etching stopper layer 17 is preferably deposited by magnetron sputtering using a target composed of at least one metal selected from the group consisting of TI, Al, Nb, Zr, Cr, W, Ta, Co, Ag, Ni, and Mo. The target preferably has a purity of 99.9% or more. In particular, the etching stopper layer 17 is preferably deposited by magnetron sputtering under an inert atmosphere, for example, an argon atmosphere and a pressure of 0.1 to 20 Pa. The sputtering pressure is more preferably 0.2 to 15 Pa, further preferably 0.3 to 10 Pa. The pressure range may be determined by adjustments of the power for deposition and the flow rate of the gaseous argon depending on, for example, the structure and capacity of the system, the evacuation capacity of the vacuum pump, and the rating capacity of the deposition power. Any flow rate of the gaseous argon may be appropriately determined depending on the volume of the sputtering chamber and the conditions for the deposition process. The sputtering power may be appropriately determined within a range of 1.0 to 15.0 W/cm$^2$ per unit area of the target in view of, for example, the uniformity of the thickness of the film and the productivity of deposition. The temperature of the carrier is preferably kept constant during deposition for achievement of uniform properties of the film (for example, the uniform resistance and crystal size of the film). The temperature of the carrier during deposition is preferably adjusted within a range of 25 to 300° C., more preferably 40 to 200° C., further preferably 50 to 150° C.

The extremely thin copper layer 18 is preferably deposited by physical vapor deposition (PVD) (preferably by sputtering) using a copper target under an inert atmosphere, for example, an argon atmosphere. The copper target is preferably composed of elemental copper that may contain incidental impurities. The copper target preferably has a purity of at least 99.9%, more preferably at least 99.99%, further preferably at least 99.999%. In order to prevent an increase in temperature during the deposition of the extremely thin copper layer 18 by PVD, a mechanism may be provided for cooling the stage in the vapor deposition system. A pressure ranging from 0.1 to 2.0 Pa is preferably applied during the deposition to keep continuous deposition without operational failure of the vapor deposition system, such as abnormal electric discharge. The pressure range may be determined by adjustments of the deposition power and the flow rate of the gaseous argon depending on, for example, the structure and capacity of the system, the evacuation capacity of the vacuum pump, and the rating capacity of the deposition power. The sputtering power may be appropriately determined within a range of 0.05 to 10.0 W/cm$^2$ per unit area of the target in view of, for example, the uniformity of the thickness of the film and the productivity of deposition.

EXAMPLES

The present invention will now be described in more detail by the following Examples.

Example 1

An intermediate layer 14 (consisting of a Ti-containing sublayer and a Cu-containing sublayer), a metal oxide sublayer 16a, a carbon sublayer 16b, an etching stopper layer 17, and an extremely thin copper layer 18 were deposited in sequence on a carrier 12 composed of a glass sheet. A copper foil with a carrier 10 was thereby produced. Detailed procedures are as follows:

(1) Provision of Carrier

A glass sheet having a thickness of 1.1 mm (material: soda-lime glass having an arithmetic mean roughness Ra: 0.6 nm, available from Central Glass Co., Ltd.) was provided.

(2) Deposition of Ti-Containing Sublayer

A Ti-containing sublayer having a thickness of 100 nm was deposited on the carrier 12 in a sputtering system under the following conditions:
   System: a single-wafer magnetron sputtering system (MLS464 available from Canon Tokki Corporation)
   Target: a Ti (purity: 99.999%) target with a diameter of 8 inches (203.2 mm)
   Ultimate vacuum: below 1×10$^{-4}$ Pa
   Carrier gas: Ar (flow rate: 100 sccm)
   Sputtering pressure: 0.35 Pa
   Sputtering power: 1000 W (3.1 W/cm$^2$)
   Deposition temperature: 40° C.

(3) Deposition of Cu-Containing Sublayer

A Cu-containing sublayer with a thickness of 100 nm was deposited on the Ti-containing sublayer in a sputtering system under the following conditions:
   System: a single-wafer DC sputtering system (MLS464 available from Canon Tokki Corporation)
   Target: a copper (purity: 99.98%) target with a diameter of 8 inches (203.2 mm)
   Ultimate vacuum: below 1×10$^{-4}$ Pa
   Gas: gaseous argon (flow rate: 100 sccm)
   Sputtering pressure: 0.35 Pa
   Sputtering power: 1000 W (6.2 W/cm$^2$)
   Deposition temperature: 40° C.

(4) Formation of Metal Oxide Sublayer

The sample including the Ti-containing sublayer and the Cu-containing sublayer was retrieved from the vacuum. The surface of the Cu-containing sublayer was exposed to air for one minute for an oxidation treatment (spontaneous oxidation) of the surface of the Cu-containing layer to form a metal oxide sublayer 16a of copper oxide. The copper oxide sublayer has an empirically estimated thickness of about 0.5 to 1.0 nm.

(5) Deposition of Carbon Sublayer

A carbon sublayer 16b of amorphous carbon with a thickness of 6 nm was deposited on the metal oxide sublayer 16a in a sputtering system under the following conditions:
   System: a single-wafer DC sputtering system (MLS464 available from Canon Tokki Corporation)
   Target: a carbon (purity: 99.999%) target with a diameter of 8 inches (203.2 mm)
   Ultimate vacuum: below 1×10$^{-4}$ Pa
   Carrier gas: Ar (flow rate: 100 sccm)
   Sputtering pressure: 0.35 Pa
   Sputtering power: 250 W (0.7 W/cm$^2$)
   Deposition temperature: 40° C.

(6) Deposition of Etching Stopper Layer

An etching stopper layer 17 of titanium having a thickness of 100 nm was deposited on the carbon sublayer 16b in a sputtering system under the following conditions:
   System: a single-wafer DC sputtering system (MLS464 available from Canon Tokki Corporation)
   Target: a titanium (purity of 99.999%) target with a diameter of 8 inches (203.2 mm)
   Carrier gas: Ar (flow rate: 100 sccm)
   Ultimate vacuum: below 1×10$^{-4}$ Pa
   Sputtering pressure: 0.35 Pa
   Sputtering power: 1000 W (3.1 W/cm$^2$)

(7) Deposition of Extremely Thin Copper Layer

An extremely thin copper layer 18 having a thickness of 300 nm was deposited on the etching stopper layer 17 in a sputtering system under the following conditions, resulting in a copper foil with a carrier 10:
- System: a single-wafer DC sputtering system (MLS464 available from Canon Tokki Corporation)
- Target: a copper (purity: 99.98%) target with a diameter of 8 inches (203.2 mm)
- Ultimate vacuum: below $1 \times 10^{-4}$ Pa
- Carrier gas: Ar (flow rate: 100 sccm)
- Sputtering pressure: 0.35 Pa
- Sputtering power: 1000 W (3.1 W/cm$^2$)
- Deposition temperature: 40° C.

Example 2

A copper foil with a carrier was produced as in Example 1 except that the metal oxide sublayer 16a of copper oxide was deposited by reactive sputtering as described below instead of exposure of the surface of the Cu-containing sublayer to air for oxidation treatment of the surface.

(Deposition of Copper Oxide Sublayer)

A copper oxide sublayer with a designed thickness of about 1 nm was deposited on the Cu-containing sublayer in a sputtering system under the following conditions:
- System: a single-wafer DC sputtering system (MLS464 available from Canon Tokki Corporation)
- Target: a copper (purity: 99.98%) target with a diameter of 8 inches (203.2 mm)
- Ultimate vacuum: below $1 \times 10^{-4}$ Pa
- Gases: gaseous argon (flow rate: 90 sccm) and gaseous oxygen (flow rate: 10 sccm)
- Sputtering pressure: 0.35 Pa
- Sputtering power: 100 W (0.3 W/cm$^2$)
- Deposition temperature: 40° C.

Example 3

A copper foil with a carrier was produced as in Example 2 except that the designed thickness of the metal oxide sublayer 16a (copper oxide sublayer) was about 2 nm.

Example 4 (Comparative Example)

A copper foil with a carrier was produced as in Example 1 except that the metal oxide sublayer 16a was not formed (in other words the surface of the Cu-containing sublayer was not exposed to air for oxidation treatment).

Example 5

A copper foil with a carrier was produced as in Example 1 except that the intermediate layer 14 had a single-layer structure consisting of an Al-containing layer deposited as described below instead of the double-layer structure consisting of the Ti-containing sublayer and the Cu-containing sublayer and that the metal oxide sublayer 16a was composed of aluminum oxide instead of copper oxide.

(Deposition of Al-Containing Layer)

An Al-containing layer having a thickness of 200 nm was deposited on the carrier 12 in a sputtering system under the following conditions:
- System: a single-wafer DC sputtering system (MLS464 available from Canon Tokki Corporation)
- Target: an Al (purity: at least 99.9%) target with a diameter of 8 inches (203.2 mm)
- Ultimate vacuum: below $1 \times 10^{-4}$ Pa
- Carrier gas: Ar (flow rate: 100 sccm)
- Sputtering pressure: 0.35 Pa
- Sputtering power: 100 W
- Deposition temperature: 40° C.

(Deposition of Aluminum Oxide Layer)

The sample including the Al-containing layer was retrieved from the vacuum. The surface of the Al-containing layer was exposed to the air for one minute for an oxidation treatment (spontaneous oxidation) of the surface of the Al-containing layer to form the metal oxide sublayer 16a of aluminum oxide.

Example 6

A copper foil with a carrier was produced as in Example 5 except that the metal oxide sublayer 16a of aluminum oxide was deposited by reactive sputtering as described below instead of exposure of the surface of the Al-containing layer to air for oxidation treatment of the surface.

(Deposition of Aluminum Oxide Sublayer)

The metal oxide sublayer 16a of aluminum oxide with a designed thickness of about 1 nm was deposited on the Al-containing layer in a sputtering system by reactive sputtering under the following conditions.
- System: a single-wafer DC sputtering system (MLS464 available from Canon Tokki Corporation)
- Target: an Al (purity: 99.99%) target with a diameter of 8 inches (203.2 mm)
- Ultimate vacuum: below $1 \times 10^{-4}$ Pa
- Gases: gaseous argon (flow rate: 90 sccm) and gaseous oxygen (flow rate: 10 sccm)
- Sputtering pressure: 0.35 Pa
- Sputtering power: 100 W
- Deposition temperature: 40° C.

Example 7

A copper foil with a carrier was produced as in Example 6 except that the designed thickness of the metal oxide sublayer 16a (aluminum oxide layer) was about 2 nm.

Example 8 (Comparative Example)

A copper foil with a carrier was produced as in Example 5 except that the metal oxide sublayer 16a of aluminum oxide was not formed (in other words, the surface of the Al-containing sublayer was not exposed to air for oxidation treatment).

Evaluation

The copper foils with carriers according to Examples 1 to 8 were subjected to various tests as described below. Table 1 shows the results of the tests. Table 1 also shows the compositions of the intermediate layers 14 and the release layers 16 and conditions for formation of the metal oxide sublayers 16a.

<Test 1: Semi-Quantitative Analysis of Release Layer>

The elemental depth profiles of the copper foils with the carriers produced in Examples 3 and 4 were each measured by XPS under the following conditions. The copper foil with the carrier was etched from the copper surface by Ar ion etching under the following conditions:

(Conditions for Ar Ion Etching)
- Accelerating voltage: 500 V
- Etched area: 2 mm by 2 mm
- Etching rate: 1.4 nm/min calculated based on $SiO_2$ (Conditions for Observation)
Device: X-ray photoelectron spectroscope (Quantum 2000 available from Ulvac-Phi, Inc.)
Excited X-rays: monochromatic Al Kα rays (1486.6 eV)
Output: 100 W
Accelerating voltage: 15 kV
Diameter of X-ray radiation: 100 μm
Observed area: 100 μm (diameter) by 1 mm
Pass energy: 23.5 eV
Energy step: 0.1 eV
Neutralizing gun: present
Observed elements and orbits: (number of sweeps:ratio: number of cycles)
O 1s: (5:6:1)
Cu 2p3: (2:6:1)
C 1s: (3:6:1)
Ti 2p: (2:6:1)
Si 2p: (1:6:1)
(Conditions for Analysis)
XPS data was analyzed with data analysis software ("MultiPak Ver. 9.4.0.7" available from Ulvac-Phi, Inc.). Smoothing was carried out at nine points. A background mode of Shirley was used. The elements for the semi-quantitative calculation were in the following background ranges:
O 1 s: 528.0 to 540.0 eV
Cu 2p3: 927.0 to 939.0 eV
C 1s: 280.0 to 292.0 eV
Ti 2p: 451.2 to 464.5 eV
Si 2p: regarded as 0 because the detected peak was below the lower limit.

Figure 2:
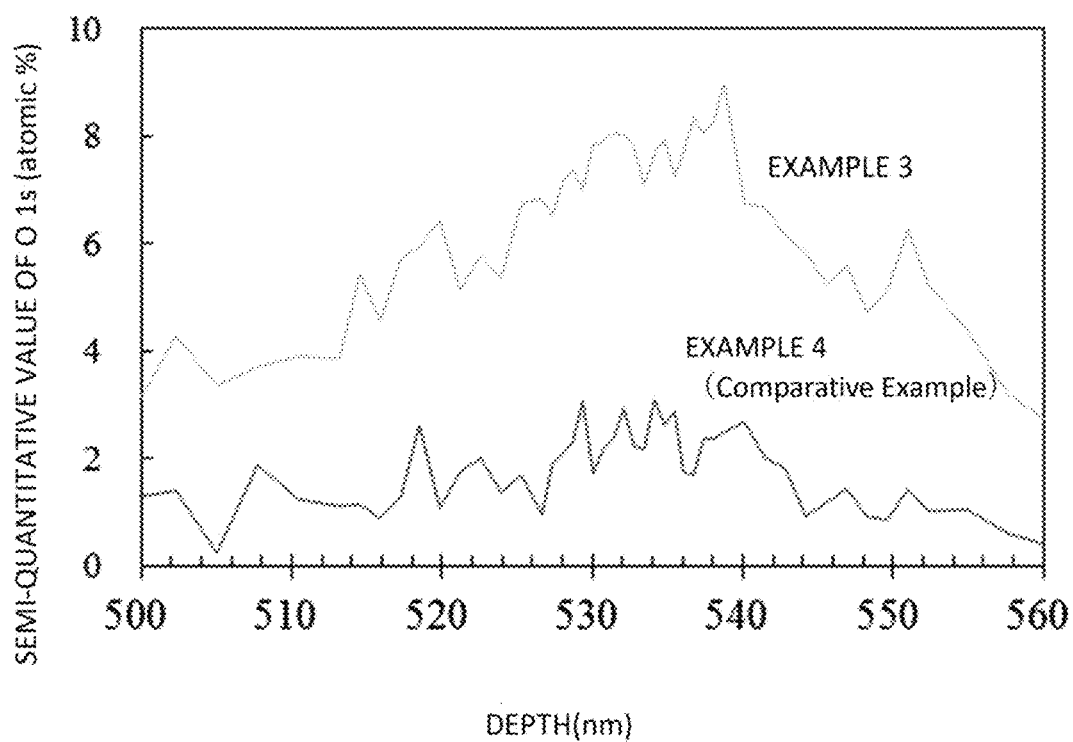
FIG. 2 is a graph showing the results of X-ray photoelectron spectroscopic (XPS) semi-quantitative analysis of release layers produced in Examples 3 and 4.

FIG. 2 shows the semi-quantitative value of the depth profile of oxygen in the release layer 16 in each sample. FIG. 2 demonstrates that Example 3, in which the copper oxide sublayer was deposited by reactive sputtering, exhibits an increase in amount of oxygen at the interface between the Cu-containing sublayer (part of the intermediate layer 14) and the release layer 16 compared to Example 4, in which the copper oxide sublayer was not formed and the oxidation treatment was not carried out. This demonstrates that the copper oxide layer is formed as the metal oxide sublayer 16a. About 2 atomic % oxygen on average is observed also in Example 4. The detected oxygen is probably an impurity trapped in the carbon sublayer 16b and the etching stopper layer 17 at the initial stage of deposition processes. The depth on the horizontal axis in FIG. 2 is determined from the etching rate based on $SiO_2$, where the etching was carried out from the start position of analysis (0 nm) i.e., the surface of the extremely thin copper layer toward the carrier of the copper foil.

<Test 2: Releasability Between Carrier and Extremely Thin Copper Layer>

The release strength of each copper foil with a carrier 10 after a thermal history of a vacuum hot press process was measured as follows: The extremely thin copper layer 18 of the copper foil with a carrier 10 was subjected to panel electrolytic copper plating with a thickness of 18 μm. The product was then subjected to a thermal history of a press process for two hours under a pressure of 30 $kgf/cm^2$ at 350° C., resulting in a copper-clad laminate. The release strength (gf/cm) of the copper-clad laminate was measured in accordance with JIS C 6481-1996 while the electrolytic copper plating layer integrated with the extremely thin copper layer 18 was released off. The observed width was 50 mm and the observed length was 20 mm. The observed release strengths (mean values) were rated on the following criteria:
Rating A: no spontaneous detachment and release strength≤50 gf/cm
Rating B: 50 gf/cm<release strength≤150 gf/cm
Rating C: spontaneous detachment occurred or release strength>150 gf/cm (including unreleasable cases)
For reference, release strengths (gf/cm) were also measured in the same manner in the cases that i) the vacuum hot press was not carried out (in other words, no heat was applied), ii) a thermal history of a press process was carried out for two hours under a pressure of 30 $kgf/cm^2$ at 250° C., and iii) a thermal history of a press process was carried out for two hours under a pressure of 30 $kgf/cm^2$ at 300° C. Table 1 shows the results.

<Test 3: Chemical Resistance of Etching Stopper Layer>

The extremely thin copper layer 18 of each copper foil with a carrier 10 was treated with a diluted sulfuric acid solution (1.8 mol/L) for removal of the oxide film on the surface, followed by washing with water and drying. A photosensitive dry film was then laminated onto the extremely thin copper layer 18 and subjected to exposure and development such that a pattern of line/space (LS)=5 μm/5 μm was given. Development was carried out by showering for two minutes at 25° C. with an aqueous sodium carbonate developer (1.0 wt %). The resultant coreless support with a wiring layer (the extremely thin copper layer 18 exposed between patterned traces) was subjected to a copper flash etching process involving immersing the coreless support in an etching solution containing a mixed solution of sulfuric acid and hydrogen peroxide for five minutes under a shower pressure of 0.1 MPa at 23° C. In this way, the extremely thin copper layer 18 exposed between the patterned traces was etched away. The coreless support with a wiring layer after the flash etching process was observed for evaluation of the chemical resistance of the etching stopper layer 17. The results were rated on the following criteria:
Rating A: The etching stopper layer remains completely.
Rating B: The etching stopper layer is slightly dissolved to an extent that may affect the subsequent process.
Rating C: The etching stopper layer is partially dissolved and probably affects the subsequent process.

TABLE 1

| | | Release layer | | | |
|---|---|---|---|---|---|
| | Intermediate layer | Sublayer adjacent to carrier | Sublayer adjacent to extremely thin copper layer | Conditions for production of metal oxide sublayer | Release strength (gf/cm) Unheated |
| Ex. 1 | Ti-containing layer/ Cu-containing layer | Copper oxide | Carbon | Spontaneous oxidation | 3.7 |
| Ex. 2 | Ti-containing layer/ Cu-containing layer | Copper oxide | Carbon | Reactive sputtering (aiming at 1 nm thick) | 3.4 |

TABLE 1-continued

| | | | | | |
|---|---|---|---|---|---|
| Ex. 3 | Ti-containing layer/ Cu-containing layer | Copper oxide | Carbon | Reactive sputtering (aiming at 2 nm thick) | 3.8 |
| Ex. 4* | Ti-containing layer/ Cu-containing layer | Single carbon layer | | — | 3.9 |
| Ex. 5 | Al-containing layer | Aluminum oxide | Carbon | Spontaneous oxidation | 6.4 |
| Ex. 6 | Al-containing layer | Aluminum oxide | Carbon | Reactive sputtering (aiming at 1 nm thick) | 9.9 |
| Ex. 7 | Al-containing layer | Aluminum oxide | Carbon | Reactive sputtering (aiming at 2 nm thick) | 10.2 |
| Ex. 8* | Al-containing layer | Single carbon layer | | — | Unreleasable |

| | Release strength (gf/cm) | | | Evaluation | |
|---|---|---|---|---|---|
| | After heated at 250° C. for 2 hours | After heated at 300° C. for 2 hours | After heated at 350° C. for 2 hours | Releasability after heated at 350° C. for 2 hours | Chemical resistance of etching stopper layer |
| Ex. 1 | 2.1 | 6.3 | 25.2 | A | A |
| Ex. 2 | 1.5 | 3.3 | 17.2 | A | A |
| Ex. 3 | Spontaneous detachment | 1.9 | 7.1 | A | A |
| Ex. 4* | 7.5 | 32.2 | Unreleasable | C | C |
| Ex. 5 | 60.1 | 99.5 | 140.8 | B | B |
| Ex. 6 | 60.9 | 93.8 | 145.3 | B | B |
| Ex. 7 | 50.0 | 100.2 | 132.4 | B | B |
| Ex. 8* | Unreleasable | Unreleasable | Unreleasable | C | C |

*indicates Comparative Example.

The invention claimed is:

1. A copper foil with a carrier, comprising:
    a carrier;
    an intermediate layer provided on the carrier;
    a release layer provided on the intermediate layer, the release layer comprising a metal oxide sublayer and a carbon sublayer; and
    an extremely thin copper layer provided on the release layer,
    wherein the intermediate layer comprises
        a Ti-containing sublayer adjoining the carrier and
        a Cu-containing sublayer adjoining the release layer, and
    wherein the metal oxide sublayer is a copper oxide layer.

2. The copper foil with a carrier according to claim 1, further comprising an etching stopper layer between the release layer and the extremely thin copper layer, the etching stopper layer being composed of at least one metal selected from the group consisting of Ti, Al, Nb, Zr, Cr, W, Ta, Co, Ag, Ni, and Mo.

3. The copper foil with a carrier according to claim 2, wherein each metal constituting the intermediate layer has a standard electrode potential equal to or higher than that of each metal constituting the etching stopper layer.

4. The copper foil with a carrier according to claim 2, wherein the etching stopper layer has a thickness of 1 to 500 nm.

5. The copper foil with a carrier according to claim 2, wherein the intermediate layer, the carbon sublayer, the metal oxide sublayer, the etching stopper layer, and the extremely thin copper layer are physical-vapor-deposited (PVD) films.

6. A method for manufacturing the copper foil with a carrier according to claim 2, comprising forming on the carrier the intermediate layer, the carbon sublayer, the metal oxide sublayer, the etching stopper layer, and the extremely thin copper layer by physical vapor deposition (PVD).

7. The copper foil with a carrier according to claim 1, wherein the metal oxide sublayer adjoins the intermediate layer and the carbon sublayer is disposed adjacent to the extremely thin copper layer.

8. The copper foil with a carrier according to claim 1, wherein the carbon sublayer adjoins the intermediate layer and the metal oxide sublayer is disposed adjacent to the extremely thin copper layer.

9. The copper foil with a carrier according to claim 1, wherein the intermediate layer has a thickness of 10 to 1000 nm.

10. The copper foil with a carrier according to claim 1, wherein the metal oxide sublayer has a thickness of 100 nm or less.

11. The copper foil with a carrier according to claim 1, wherein the carbon sublayer has a thickness of 1 to 20 nm.

12. The copper foil with a carrier according to claim 1, wherein the extremely thin copper layer has a thickness of 10 to 1000 nm.

13. A method of using a copper foil with a carrier, comprising:
    exposing the copper foil with a carrier according to claim 1 to a temperature of 350° C. or more.

14. A copper foil with a carrier, comprising:
    a carrier;
    an intermediate layer provided on the carrier;
    a release layer provided on the intermediate layer, the release layer comprising a metal oxide sublayer and a carbon sublayer; and an extremely thin copper layer provided on the release layer,
wherein the intermediate layer is an Al-containing layer and the metal oxide sublayer is an aluminum oxide layer.

15. The copper foil with a carrier according to claim 14, further comprising an etching stopper layer between the release layer and the extremely thin copper layer, the etching stopper layer being composed of at least one metal selected from the group consisting of Ti, Al, Nb, Zr, Cr, W, Ta, Co, Ag, Ni, and Mo.

16. The copper foil with a carrier according to claim 15, wherein each metal constituting the Al-containing layer has a standard electrode potential equal to or higher than that of each metal constituting the etching stopper layer.

17. The copper foil with a carrier according to claim 14, wherein the aluminum oxide layer adjoins the Al-containing layer and the carbon sublayer is disposed adjacent to the extremely thin copper layer.

18. The copper foil with a carrier according to claim 14, wherein the carbon sublayer adjoins the Al-containing layer and the aluminum oxide layer is disposed adjacent to the extremely thin copper layer.

19. The copper foil with a carrier according to claim 14, wherein the Al-containing layer has a thickness of 10 to 1000 nm.

20. The copper foil with a carrier according to claim 14, wherein the aluminum oxide layer has a thickness of 100 nm or less.

* * * * *